United States Patent [19]

Nakano

[11] Patent Number: 4,541,074
[45] Date of Patent: Sep. 10, 1985

[54] SEMICONDUCTOR DEVICE FOR MEMORY CELL

[75] Inventor: Motoo Nakano, Yokohama, Japan

[73] Assignee: Fujitsu Limited, Kawasaki, Japan

[21] Appl. No.: 393,118

[22] Filed: Jun. 28, 1982

[30] Foreign Application Priority Data

Jun. 30, 1981 [JP] Japan .................. 56-102902

[51] Int. Cl.³ ............................................ G11C 11/40
[52] U.S. Cl. ..................................... 365/178; 365/182
[58] Field of Search ............... 365/178, 174, 189, 230, 365/182

[56] References Cited

U.S. PATENT DOCUMENTS 3,855,610  12/1974  Masuda et al. .
4,096,522   6/1978  Suzuki et al. .
4,198,693   4/1980  Kuo ..................................... 365/178
4,333,164   1/1982  Orikabe et al. ...................... 365/178
4,342,100   7/1982  Kuo ..................................... 365/178

FOREIGN PATENT DOCUMENTS

0010139  10/1978  European Pat. Off. .
2223841  10/1974  France .

Primary Examiner—Terrell W. Fears
Attorney, Agent, or Firm—Staas & Halsey

[57] ABSTRACT

A ROM including memory cells having characteristics corresponding to the "1" or "0" information to be stored, the correspondence to "1" or "0" information being achieved by changing the conductivity type of at least a portion of a semiconductor layer in the semiconductor devices of the memory cells.

8 Claims, 23 Drawing Figures

SEMICONDUCTOR DEVICE FOR MEMORY CELL

BACKGROUND OF THE INVENTION

The present invention relates to a semiconductor device used for a memory cell. The semiconductor memory device of the present invention is used, for example, for a memory cell of a read-only memory (ROM).

There are two prior art methods for forming "ON" or "OFF" states of a memory cell of a ROM. The first method is to change the threshold voltage of a field effect transistor (FET) to correspond to the "ON" or "OFF" state, the second method is to utilize a contact hole in the structure of an FET.

In the first method, the threshold voltage of a metal-oxide semiconductor (MOS) type FET is changed either by changing the thickness of the gate oxide layer or by ion implantation into the channel region. In the former technique, provision of a thick gate oxide layer results in a high threshold voltage, wherein the FET does not become "ON", while provision of a thin layer results in a low voltage, wherein the FET does become "ON". In the latter technique, boron is the type of ion implanted in the channel region to change the conductivity type from p type to p+ type and, accordingly, to increase the threshold voltage.

As is well known, however, a write-in of the cells of a ROM must, from the viewpoint of convenience to manufacturers and users, be carried out at a relatively later stage in the ROM manufacturing process. For this reason, the above described method of changing the threshold voltage is inappropriate, because the above-described techniques for changing the threshold voltage have to be effected at a relatively early stage in the ROM manufacturing process.

In the second method, a contact hole is formed to connect the source of the substrate and the word line in the vicinity of the gate electrode. Specifically, a window is formed in the oxide layer in the vicinity of the gate electrode.

In such a structure, however, the contact hole must be formed at a certain distance from the gate electrode in order to prevent short-circuits therebetween. Therefore sufficient tolerance must be provided in forming the window in the oxide layer. This increases the length of the n+ type region of the substrate for the contact hole portion, thereby increasing the size of the FET unit and preventing the realization of a highly integrated device.

SUMMARY OF THE INVENTION

An object of the present invention is to provide an improved semiconductor device used for a memory cell, in which the write-in of the memory cell is carried out at a relatively later stage in the ROM manufacturing process.

Another object of the present invention is to provide high precision alignment in the patterning of a contact portion for a polycrystalline silicon gate portion of a semiconductor device for a memory cell.

According to a fundamental aspect of the present invention, there is provided a semiconductor device for a memory cell of a ROM. The semiconductor device comprises a semiconductor substrate, an insulator layer formed on the semiconductor substrate, and a semiconductor layer, formed on the insulator layer and adapted to provide the memory cell with characteristics corresponding to "1" or "0" information to be stored. The correspondence to "1" or "0" information is achieved by changing the conductivity type of at least a portion of the semiconductor layer in the semiconductor device.

BRIEF DESCRIPTION OF THE DRAWINGS

FIGS. 5A, 5B-1, 5B-2, 5C-1, 5C-2, 5D-1, 5D-2, 5E-1, 5E-2, 5F-1, 5F-2, 5G, 5H, and 5I are examples of the sequence of processes for the manufacture of the device of FIGS. 4A and 4B;

DESCRIPTION OF THE PREFERRED EMBODIMENTS

Figure 1:
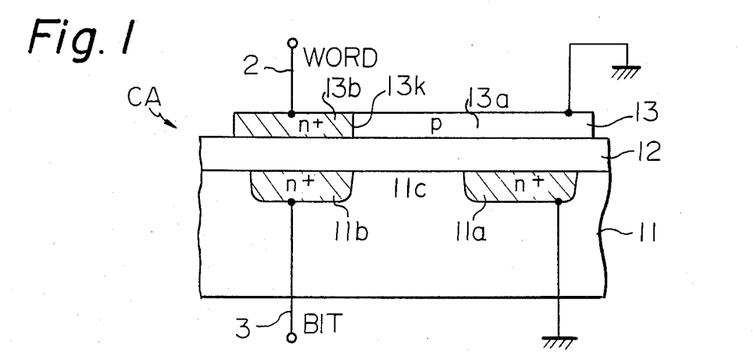
FIGS. 1 and 2 are models of the structure of the semiconductor device used for a memory cell in accordance with the present invention.
Figure 2:
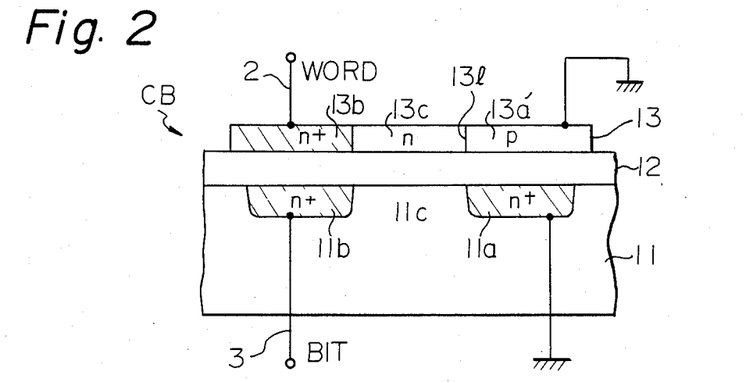

Models of the structure of the semiconductor device used for a memory cell in accordance with an embodiment of the present invention are illustrated in FIG. 1 and FIG. 2.

FIG. 1 shows a non-written-in state semiconductor device CA. The semiconductor device CA of FIG. 1 comprises a p type silicon substrate 11, an n+ type source 11a, an n+ type drain 11b, a gate oxide layer 12 of silicon dioxide, and a polycrystalline silicon gate layer 13, altogether forming a Metal-Insulator-Semiconductor (MIS) type FET. The polycrystalline silicon gate layer 13 comprises a p type region 13a and an n+ type region 13b. Over the channel region 11C, between the source 11a and the drain 11b, there exists a portion of the p type region 13a of the gate layer 13. The n+ type region 13b is connected to a word line 2, while the p type region 13a is grounded. The drain 11b is connected to a bit line 3, while the source 11a is grounded.

The semiconductor device CA of FIG. 1 is therefore an FET in the "OFF" or inoperative state. Since the p type region 13a of the gate layer 13 is grounded, even the application of a positive potential to the word line 2 will not cause the FET to become "ON".

FIG. 2 shows a written-in state semiconductor device CB. The semiconductor device CA of FIG. 1 is changed into the semiconductor device CB of FIG. 2 by ion implantation at the predetermined region 13c of the p type region 13a of the gate layer 13. Such ion implantation changes the conductivity type of the predetermined region 13c from p to n. Hence, the pn junction in the gate layer 13 changes in position from 13k in FIG. 1 to 13l in FIG. 2.

The semiconductor device CB of FIG. 2 is therefore an FET in the "ON " or operative state. Since the potential of the word line 2 is substantially applied to the n type region 13c, the application of a positive potential to the word line 2 will cause the FET to become "ON". These operative and inoperative states of the FET correspond to the "1" and "0" information to be stored, respectively.

Figure 3:
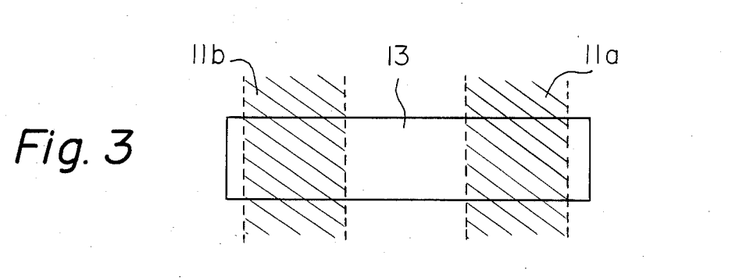
FIG. 3 is a top plan view of the model of FIG. 2.

A top plan view of the model of FIG. 2 is illustrated in FIG. 3.

Figure 4A:
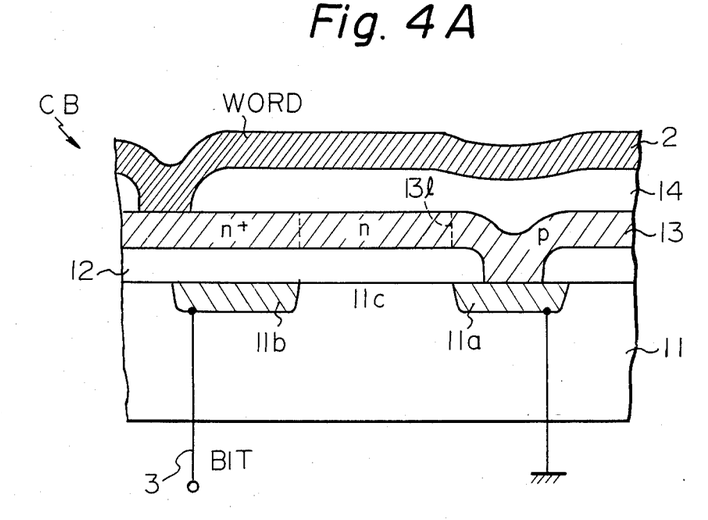
FIG. 4A is the actual structure of the device according to the model of FIG. 2.

The actual structure of the device of FIG. 2 is illustrated in FIG. 4A. The semiconductor device CB comprises a p type silicon substrate 11, an n+ type source 11a, an n+ type drain 11b, a channel 11c, a gate oxide layer 12 of silicon dioxide, a polycrystalline silicon gate layer 13 comprising n+, n, and p type regions, a silicon dioxide layer 14, and a word line layer 2 of aluminum. The source 11a is grounded, while the drain 11b is connected to a bit line 3. A sectional view of the structure of FIG. 4A is illustrated in FIG. 4B.

Figure 4B:
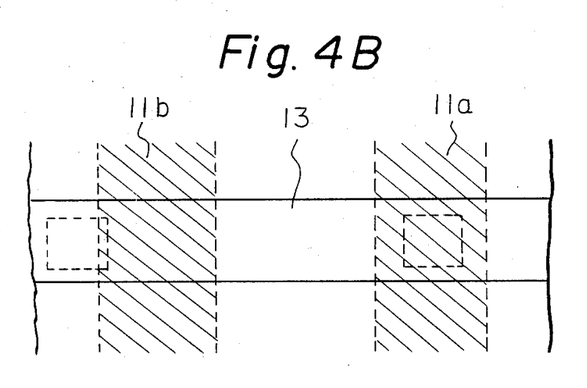
FIG. 4B is a sectional view of the structure of FIG. 4A.

An example of a sequence of processes for the manufacture of the devices CB of FIGS. 4A and 4B is illustrated in FIGS. 5A, 5B-1, 5B-2, 5C-1, 5C-2, 5D-1, 5D-2, 5E-1, 5E-2, 5F-1, 5F-2, 5G, 5H, and 5I. A variation on part of the sequence of processes is illustrated in FIGS. 5J and 5K.

Figure 5A:
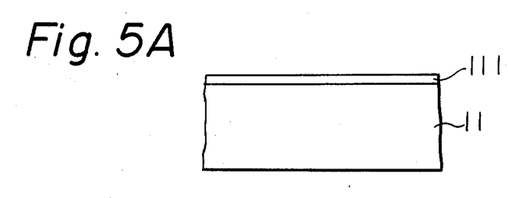

Referring to FIG. 5A, an oxide layer 111 of silicon dioxide is formed by the ordinary oxidization process on a p type silicon substrate 11.

Figure 5B:
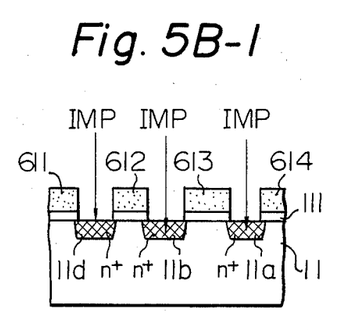
Figure 5B:
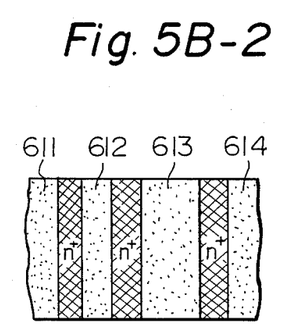

Referring to FIGS. 5B-1 and 5B-2, a photoresist layer is formed on the oxide layer 111. The photoresist layer is patterned to form patterns 611, 612, 613, and 614. The oxide layer 111 is then etched using the patterns 611, 612, 613, and 614 as a mask. Ion implantation IMP is carried out with, for example, a dose of arsenic at $5 \times 10^{15}$ per cm$^2$, to form n+ layers 11a, 11b, and 11d in the silicon substrate 11.

Figure 5C:
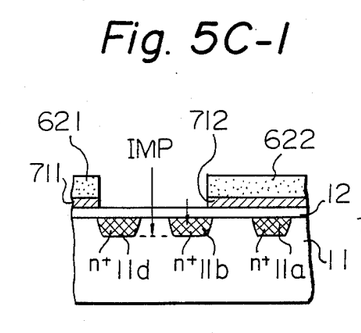
Figure 5C:
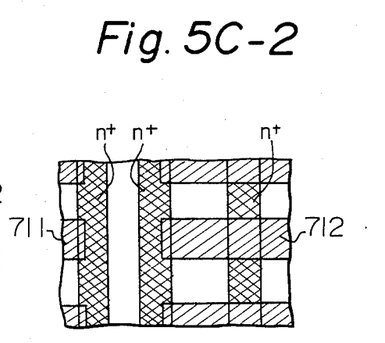

Referring to FIGS. 5C-1 and 5C-2, the photoresist layer patterns 611, 612, 613, and 614 and the oxide layer 111 are removed. Another oxide layer 12 is formed by the ordinary oxidation process on the p type silicon substrate 11 having n+ layers 11a, 11b, and 11d. A silicon nitride layer is formed on the oxide layer 12 by the chemical vapor growth process. A photoresist layer is formed on the silicon nitride layer and is patterned to form patterns 621 and 622. The nitride layer is then etched by using the patterns 621 and 622 as a mask. Ion implantation IMP is carried out with, for example, a dose of boron at $1 \times 10^{13}$ per cm$^2$, to increase the impurity concentration in the silicon substrate to prevent the formation of a parasitic channel.

Figure 5D:
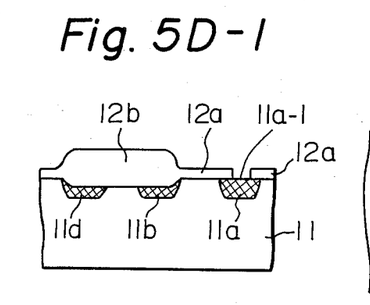
Figure 5D:
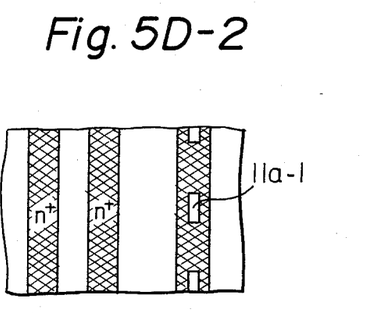

Referring to FIGS. 5D-1 and 5D-2, the photoresist layer patterns 621 and 622 are removed. Then, a field oxide layer 12b is formed by the field oxidation process. The silicon nitride layers 711 and 712 are removed by the etching process. Then, a contact portion opening 11a-1 is formed in the oxide layer 12a to provide the grounding means for the polycrystalline silicon layer formed in the following step.

Figure 5E:
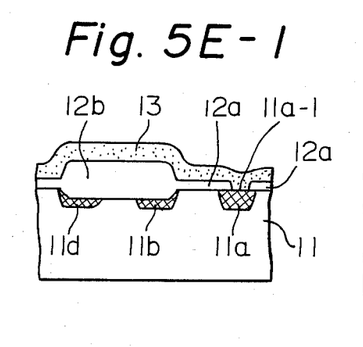
Figure 5E:
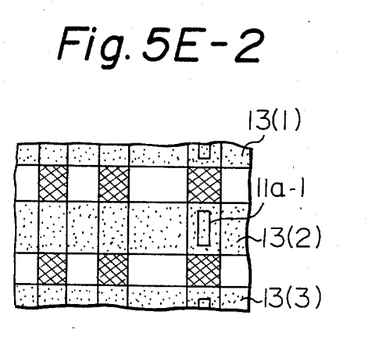

Referring to FIGS. 5E-1 and 5E-2, a polycrystalline silicon layer 13 is formed by a chemical vapor growth process at a temperature of, for example, 1200° C., or an annealing treatment by laser irradiation is carried out in order to obtain a good quality pn junction. Ion implantation with, for example, a dose of boron of $1 \times 10^{14}$ per cm$^2$ is carried out. After that, the polycrystalline silicon layer is patterned to form gate portions 13(1), 13(2), and 13(3).

Figure 5F:
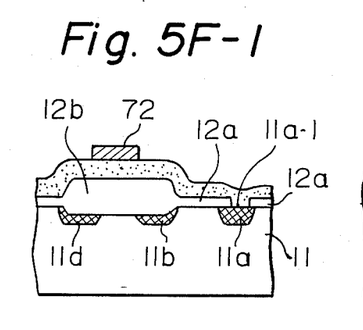
Figure 5F:
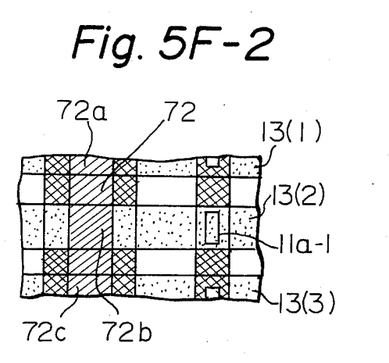

Referring to FIGS. 5F-1 and 5F-2, a silicon nitride layer is formed over the entire surface of the device of FIG. 5E-2 by a chemical vapor growth process. The stripe 72 of the silicon nitride is then patterned.

The areas where the silicon nitride stripe 72 and the polycrystalline silicon gate patterns 13(1), 13(2), and 13(3) intersect constitute the contact portions 72a, 72b and 72c. Thus, high precision alignment between the silicon nitride layer 72 and the polycrystalline silicon gate patterns 13(1), 13(2), and 13(3) is realized automatically.

Figure 5G:
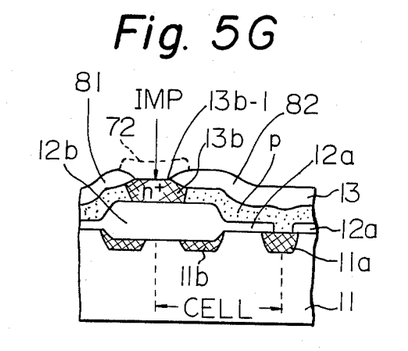

Referring to FIG. 5G, silicon oxide layers 81 and 82 are formed by a selective oxidation process using the silicon nitride stripe 72. Then, the silicon nitride stripe 72 (shown by a broken line) is removed by etching. Ion implantation IMP of, for example, a dose of arsenic at $5 \times 10^{15}$ per cm$^2$, is carried out to form the n+ portion 13b in the polycrystalline silicon gate portion 13.

It can be understood that the portion CELL in the device of FIG. 5G constitutes a cell corresponding to the cell CA of FIG. 1. The write-in process for the change of the cell CA of FIG. 1 to the cell CB of FIG. 2 is given below.

Figure 5H:
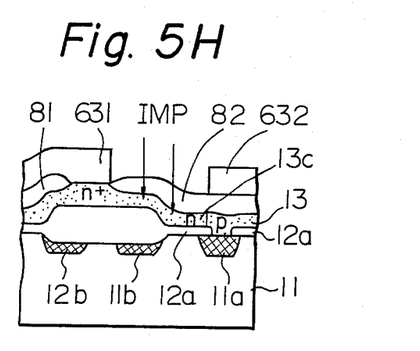

Referring to FIG. 5H, a photoresist layer is formed on the top of the device. The photoresist layer 63 is then patterned to form patterns 631 and 632. Ion implantation IMP of phosphor into the polycrystalline silicon layer 13 through the silicon oxide layer 82 is carried out by using the patterns 631 and 632 as a mask, thereby forming an n type region 13c in the polycrystalline silicon layer 13.

Figure 5I:
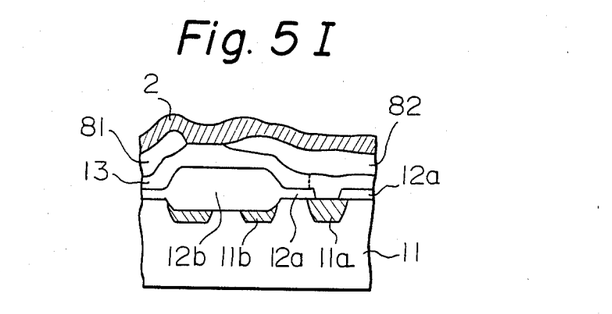
Figure 5J:
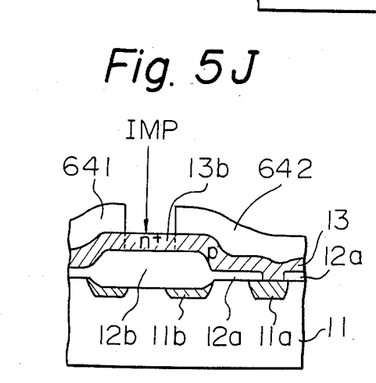
FIGS. 5J and 5K are variations for part of the sequence of processes for the manufacture of the device of FIGS. 4A and 4B.
Figure 5K:
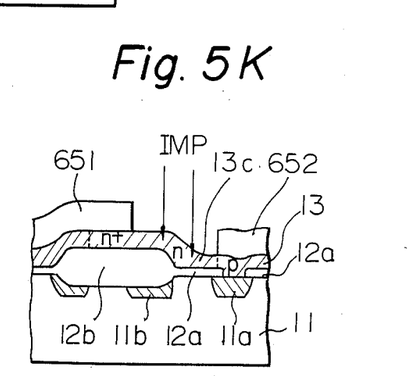

Referring to FIG. 5I, the photoresist patterns 631 and 632 are removed, then heat treatment for activating the device is carried out. An aluminum conductor 2 is attached to the top of the device to provide a word line.

FIGS. 5J and 5K show a sequence of alternative processes after the process shown in FIG. 5E-1 and FIG. 5E-2. This sequence may be employed if ion implantation of phosphor to the polycrystalline silicon layer 13 is difficult because of too large a thickness of the silicon oxide layer 82. In this sequence, a photoresist layer is formed over the polycrystalline silicon layer 13 and is patterned to form patterns 641 and 642. Ion implantation IMP of arsenic is then carried out to form the n+ region 13b (FIG. 5J).

The photoresist layers 641 and 642 are removed. A photoresist layer is then formed on the polycrystalline silicon layer 13 and patterned to form patterns 651 and 652. Ion implantation IMP of phosphor to the polycrystalline silicon layer 13 is then carried out to form an n type region 13c (FIG. 5K).

The process of FIG. 5K is followed by the sequence of processes of FIGS. 5F-1 and 5F-2, FIG. 5G, and FIG. 5I.

Figure 6:
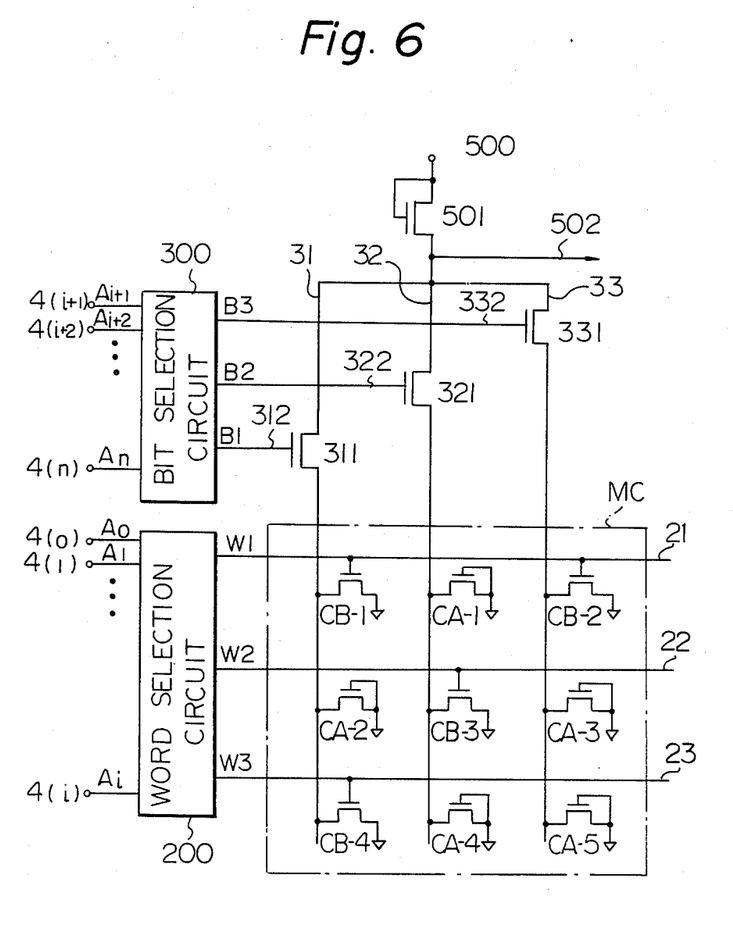
FIG. 6 is a ROM constructed by using the memory cells of FIGS. 4A and 4B.

A ROM constructed using the memory cell of FIGS. 1 and 2 is illustrated in FIG. 6. The ROM of FIG. 6 comprises a matrix arrangement of the word lines 21, 22, and 23 and the bit lines 31, 32, and 33; a word selection circuit 200; and a bit selection circuit 300. The word lines 21, 22 and 23 are arranged as X-axis lines, while the bit lines 31, 32 and 33 are arranged as Y-axis lines. The power source voltage is supplied via a transistor 501 to the bit lines 31, 32, and 33. The output signals B1, B2, and B3 of the bit selection circuit 300 are supplied to the gates of the transistors 311, 321, and 331 inserted in the bit lines 31, 32, and 33, respectively.

In the memory cell member MC of the ROM of FIG. 6, memory cells can be arranged at the intersections of the matrix arrangement. Memory cell CB-1 is located at the 21-31 intersection, memory cell CB-2 is located at the 21-33 intersection, memory cell CB-3 is located at the 22-32 intersection, and memory cell CB-4 is located at the 23-31 intersection. At the other sections, memory cells CA-1, CA-2, CA-3, CA-4 and CA-5 are located.

Upon application of an address signal $A_0, A_1 \ldots A_i$ ; $A_{i+1}, A_{j+2}, \ldots$. An is supplied to the input terminals $4(0), 4(1), \ldots, 4(i), 4(i+1), 4(i+2), \ldots 4(n)$ of the word selection circuit 200 and the bit selection circuit 300. The selection of the word lines and the bit lines is carried out so that the memory cell corresponding to the address signal is selected. The selected memory cell operates as a transistor, hence the "0" level signal is produced at the output terminal 502 of ROM of FIG. 6. A another use of the memory cell of FIGS. 1 and 2, the logic array illustrated in FIG. 7 can be constructed. The logic array of FIG. 7 comprises the input lines R, S, and T and the output lines U, V, and W. The memory cells CB-1, CB-2, CB-3, and CB-4 in the form of the FET of FIG. 4A are located at the predetermined intersections of the input and the output lines. At the other intersections, memory cells CA-1, CA-2, CA-3, CA-4, and CA-5 are located.

Figure 7:
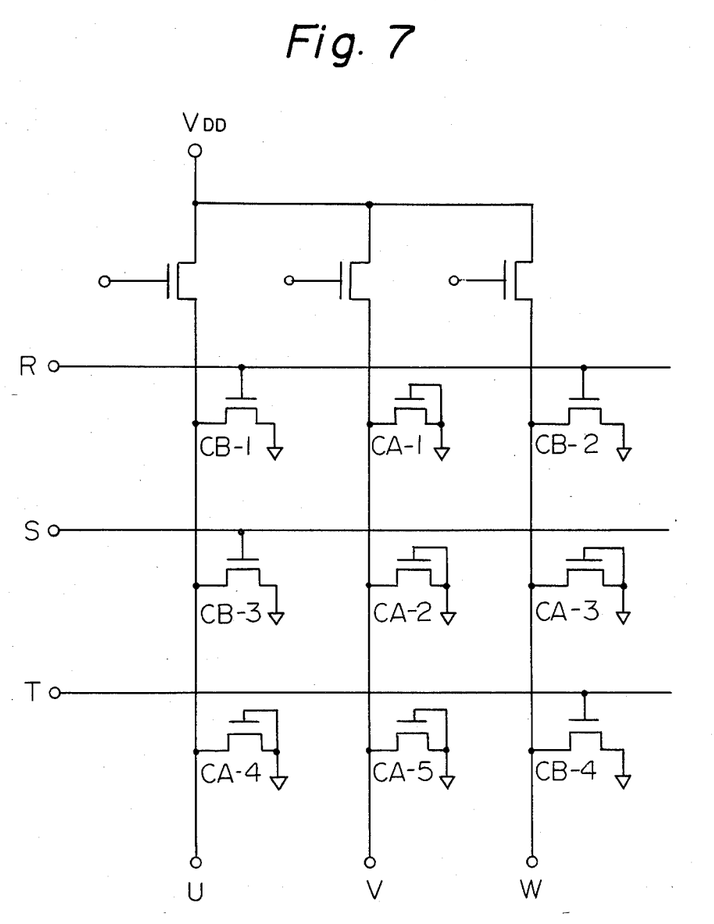
FIG. 7 is a logic array constructed by using the memory cell of FIGS. 4A and 4B.

When the potential of the input line R is "1", the potentials of the output lines U and W are "0". When the potential of the input line S is "1", the potential of the output line U is "0". When the potential of the input line T is "1", the potential of the output line W is "0". Accordingly, for example, if the input signal [R, S, T]=[1, 1, 0] is applied to the input lines R, S, and T, the output signal [U, V, W]=[0, 1, 0] is obtained at the output lines U, V, and W. Thus, a logic array for obtaining the signal [U, V, W] having a predetermined logic relationship with the signal [R, S, T ] is realized.

Although preferred embodiments have been described hereinbefore, it should be understood that various modifications and alterations are possible in the embodiments without departing from the scope of the present invention.

I claim:

1. A semiconductor device for a memory cell of a read-only memory for storing "1" or "0" information, the semiconductor device comprising:
   a semiconductor substrate;
   an insulator layer formed on said semiconductor substrate; and
   a semiconductor layer, formed on said insulator layer and having a PN junction formed therein, for providing the memory cell with the "1" or "0" information to be stored, the "1" or "0" information being stored in accordance with the position of said PN junction in said semiconductor layer.

2. A semiconductor device for a memory cell of a read-only memory and for storing "1" or "0" information, the semiconductor device comprising:
   a metal insulator semiconductor transistor for forming the memory cell, comprising:
   a semiconductor substrate;
   an insulator layer formed on said semiconductor substrate; and
   a semiconductor layer, formed on said insulator layer and having a PN junction formed therein, for providing the memory cell with the "1" or "0" information to be stored, the "1" or "0" information being stored in accordance with the position of said PN junction in said semiconductor layer.

3. A semiconductor device for a memory cell of a read-only memory, having a plurality of X-axis lines, a plurality of Y-axis lines and a plurality of memory cells located at the intersections of said X- and Y-axis lines, the semiconductor device comprising:
   a semiconductor substrate having impurity regions, for forming the plurality of Y-axis lines;
   an insulator layer formed on said semiconductor substrate;
   a semiconductor layer, formed on said insulator layer and having a PN junction formed therein, for forming memory cells having characteristics corresponding to "1" or "0" information to be stored, said correspondence to "1" or "0" information being achieved by storing the information in accordance with the position of said PN junction in said semiconductor layer; and
   conductor layers, formed on portions of said semiconductor layer, for forming the plurality of X-axis lines.

4. A semiconductor device read-only memory cell having a bit line and a word line, comprising:
   a substrate of a first conductivity type;
   a source region of a second conductivity type opposite that of the first conductivity type, formed in said substrate and operatively connected to ground;
   a drain region of the second conductivity type, formed in said substrate and operatively connected to the bit line;
   a channel region formed in said substrate between said source and drain regions;
   a gate oxide layer formed on said substrate, said drain and channel regions; and
   a polycrystalline silicon layer having a PN junction formed therein and formed on said gate oxide layer, having a region of the first conductivity type formed on said channel and source regions, and a region of the second conductivity type formed on said drain region, said first conductivity type region being operatively connected to ground and said second conductivity type region being operatively connected to the word line, information being stored in said read-only memory in accordance with the location of said PN junction in said first conductivity type region.

5. A semiconductor device read-only memory cell having a bit line and a word line, comprising:
   a substrate of a first conductivity type;
   a source region of a second conductivity type opposite that of the first conductivity type, formed in said substrate and operatively connected to ground;
   a drain region of the second conductivity type, formed in said substrate and operatively connected to the bit line;
   a channel region formed in said substrate between said source and drain regions;
   a gate oxide layer formed on said substrate, said drain and channel regions; and
   a polycrystalline silicon layer having a PN junction formed therein, and formed on said gate oxide layer, having a region of the first conductivity type formed on said source region and having a region of the second conductivity type formed on said drain and channel regions, said first conductivity type region being operatively connected to ground and said second conductivity type region being operatively connected to the word line, information being stored in the polycrystalline silicon layer in accordance with the position of said PN junction.

6. A semiconductor device as recited in claim 4, further comprising a silicon dioxide layer formed on said polycrystalline silicon layer, and wherein said word line comprises an aluminum word line layer formed on said silicon dioxide layer.

7. A semiconductor device as recited in claim 5, further comprising a silicon dioode layer formed on said polycrystalline silicon layer, and wherein said word line comprises an aluminum word line layer formed on said silicon dioxide layer.

8. A semiconductor read-only memory cell device having a semiconductor substrate, comprising:
   impurity regions formed in the substrate;
   an insulator layer formed on the substrate;
   a semiconductor layer, formed on said insulator layer and having a PN junction formed therein at a first portion, for forming memory cells for storing "1" or "0" information in accordance with the position of said PN junction in said first portion of said semiconductor layer;
   conductor layers formed on second portions of said semiconductor layer;
   N X-axis lines formed by said conductor layers, where N is an integer greater than 1;
   M Y-axis lines, formed by said impurity regions, intersecting said N X-axis lines, where M is an integer greater than 1; and
   N X M of said memory cells located at the intersections of said N X-axis lines and said M Y-axis lines.

* * * * *